United States Patent

[11] 3,624,677

[72] Inventor Allan Pearson
Tewin, England
[21] Appl. No. 735,625
[22] Filed June 10, 1968
[45] Patented Nov. 30, 1971
[73] Assignee Westinghouse Brake and Signal Company Limited
London, England
[32] Priority June 27, 1967
[33] Great Britain
[31] 29,560/67

[54] MANUFACTURE OF SEMICONDUCTOR ELEMENTS
2 Claims, 6 Drawing Figs.

[52] U.S. Cl. .......... 29/583, 83/49, 51/59
[51] Int. Cl. .......... B01j 17/00, H01l 7/66
[50] Field of Search .......... 29/583, 591, 580; 51/283, 59 SS

[56] References Cited

UNITED STATES PATENTS

| | | | |
|---|---|---|---|
| 2,784,479 | 3/1957 | Roberts | 29/583 |
| 3,307,240 | 3/1967 | Ginsbach et al. | 29/583 |
| 3,326,071 | 6/1967 | Bushman et al. | 83/568 |
| 2,743,506 | 5/1956 | Solow | 29/583 |
| 3,054,709 | 9/1962 | Freestone et al. | 29/413 |
| 3,332,143 | 7/1967 | Gentry | 29/583 |

*Primary Examiner*—John F. Campbell
*Assistant Examiner*—W. Tupman
*Attorney*—Larson, Taylor and Hinds ABSTRACT: A method of manufacturing semiconductor elements of truncated pyramidal form, which method includes the steps of forming in a wafer of semiconductor material having opposed major faces a PN junction extending parallel to and lying between the major faces of the wafer, and subsequently cutting the wafer into a plurality of discrete semiconductor elements by a plurality of crisscross cuts the sidewalls of each of which are inclined at an angle of other than 90° to the PN junction.

MANUFACTURE OF SEMICONDUCTOR ELEMENTS

The present invention provides a method of forming elements of truncated-pyramidal form from a wafer and is applicable to the manufacture of semiconductor elements.

The present invention provides a method of manufacturing semiconductor elements of truncated-pyramidal form, which method includes the steps of forming in a wafer of semiconductor material having opposed major faces a PN-junction extending parallel to and lying between the major faces of the wafer, and subsequently cutting the wafer into a plurality of discrete semiconductor elements by a plurality of criss-cross cuts the sidewalls of each of which are inclined at an angle of other than 90° to the PN-junction.

The cutting of the wafer may be achieved by effecting oscillating contact between the wafer and a formed cutting tool. Various forms of tool may be utilized. Thus, the tool may be an oscillating blade having sidefaces inclined to one another. Alternatively, a plurality of such blades arranged parallel to one another.

In a preferred embodiment, the method comprises effecting oscillating contact between the wafer and a tool having plurality of cutting members or knife edges each having a cross section increasing from the cutting edge thereof to correspond with the desired angle of cut (and thus to the angle between converging opposite faces of the elements being produced), the cutting members or knife edges being arranged in immovably parallel relationship with one another.

Such a tool may be of integral construction being formed on one face thereof with the plurality of knife edges. Alternatively, the knife edges may be provided one on each of a plurality of members contiguously fixed together in immovable parallel relationship with the other and, in this case, the members may be so fixed in a rigid support. The width of the plurality of knife edges may be greater than the width of the wafer and the length of the knife edges is preferably greater than the length of the wafer.

Abrasive material may be fed to the knife edge (s) during the oscillation of the tool or abrasive material in paste form may have been positioned on the wafer prior to the oscillation of the tool.

The wafer, during the method, may be secured to one face of a glass plate which is secured by its opposite face to a support. The wafer/glass plate/support may be secured one to the other by wax.

It has been found that by the use of a tool comprising an appropriately serrated cutting plate formed from a solid block semiconductor elements of truncated-pyramidal form may be produced economically to a high degree of accuracy and in a substantially continuous manner. This result is surprising inasmuch as when a tool having separate blades is used the spaces between the blades permit a continuous supply of abrasive slurry to the cutting edge of the blades to effect abrasion of the wafer. When a tool formed from a solid block is used, this is clearly more difficult but highly satisfactory results were obtained by the single application of abrasive media in paste form. A further advantage of the plate as compared with separate blades is that, in each traverse, the trailing edge of the plate may overrun the wafer leading to more uniform wear of the cutting plate.

Many variations of design of a solid cutting plate may be used. Preferably the radius of the crests of the serrations does not exceed 0.002 of an inch. Serration of the cutting plates can be carried out readily and cheaply by many known methods and the resulting plate is cheap as compared with multiblade packages and diamond wheels. In addition to initial economy, an important advantage is that when worn to inacceptable limits the serrated form can rapidly and economically be reground to the original accuracy. It is also economical to provide two or more similar serrated plates so that a new plate can be inserted into the machine quickly and used while the worn plate is being reground. It is also practicable that both sides of the plate be serrated so that when one side is worn the plate can be inverted and replaced in the plate-holder.

Embodiments of the present invention will now be described in greater detail, by way of example only, with reference to the accompanying drawings of which:

Figure 1:
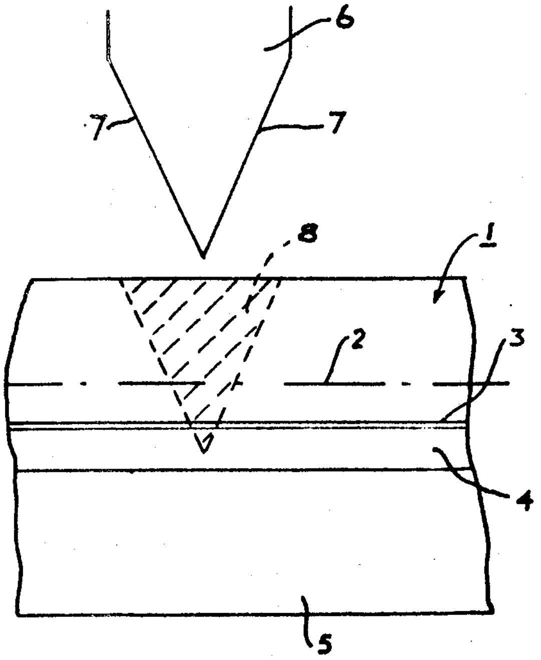
FIG. 1 illustrates the method of manufacture.

As shown in FIG. 1 (which is, of course, only a partial view of the total assembly), a wafer 1 of semiconductor material having formed therein a PN-junction 2 is secured by a layer of wax 3 to a glass wafer 4 which is in turn secured by a layer of wax 9 to a support 5. The wafer 1 mounted on the support 5 in the manner above described, is then located under a cutting tool comprising a series of parallel-arranged knife-edged blades 6 (of which one only is shown in transverse cross section in FIG. 1). Each of the blades 6 have mutually inclined sides 7 and are arranged to be oscillatable in the longitudinal direction of the blades 6 across the wafer 1. The blades 6 are then fed with an abrasive material and the blades 6 lowered into contact with the wafer 1 so that, upon oscillation of the blades and the feeding thereof into the wafer each blade 6 cuts through the wafer 1 and just into the glass slice 4 by removing the material 8 shown in dotted lines in FIG. 1.

Figure 2:
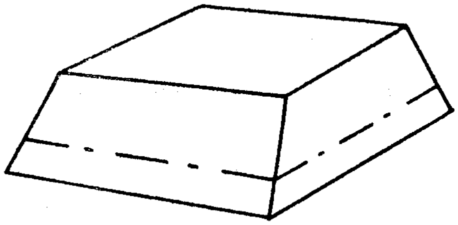
FIG. 2 shows the resultant semiconductor element.

After the blades 6 have cut to the required depth and thereafter retracted, the wafer 1 is turned through an angle of 90° and the cutting operation repeated so that the wafer 1 is thereby divided into a plurality of square plan-view elements each of the configuration shown in FIG. 2. That is to say, each is of square plan-view configuration, and has tapered sidewalls so that the element is, therefore, in the form of a four-sided truncated pyramid.

Figure 3:
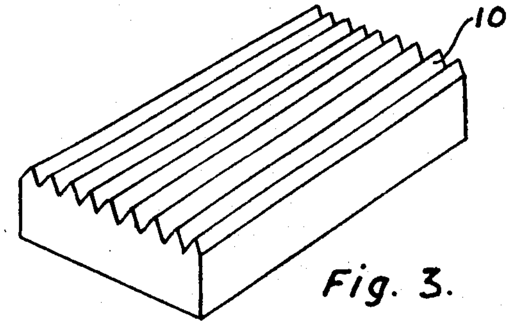
FIGS. 3 to 6 show alternative forms of tools.

In the embodiment above described, the tool is specified as comprising a series of parallel arranged knife-edged blades 6 but the tool may alternatively take the form shown in FIG. 3 of the accompanying drawings, in which form the tool is of integral construction being formed on the face 10 with the plurality of knife edges.

Figure 4:
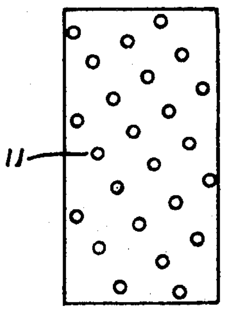

FIG. 4 illustrates an alternative form of tool generally similar to that of FIG. 3, except that the tool has extending through it to the face 10, a plurality of apertures 11 through which abrasive material can be fed to the knife edges, the side of the tool reverse from the face 10 being shown in FIG. 4.

Figure 5:
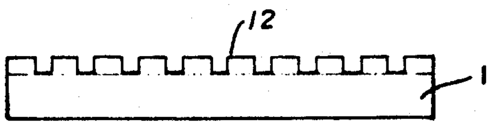

Another alternative form of tool is shown in FIG. 5. The tool is similar in configuration to the tool of FIG. 3 but, in the tool of FIG. 5, grooves 3 are cut extending transversely across the knife edges.

Figure 6:
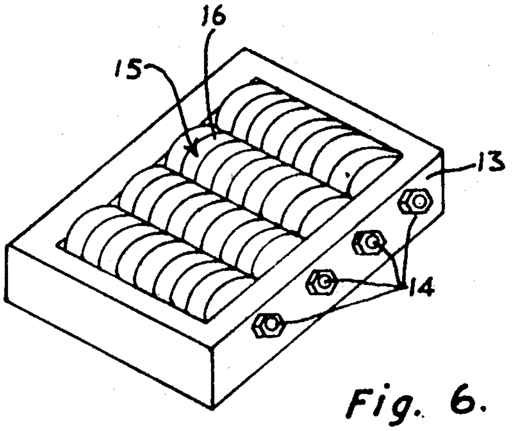

In a further alternative form of tool, illustrated in FIG. 6, the knife edges are therein formed on suitable metal rolls or rods 15 by forming circumferential grooves 16. A selected number of rolls 15 are rotatably mounted in a frame 13 in close contact with each other and locked in one angular position by nuts 14. When worn, each roll is rotated about 10° to present a new cutting face and the assembly again locked in position. Not only does this permit 36 new positions, but when finally worn, the rolls can readily be reground to the new condition.

The following examples are given by way of illustration and without limitation.

EXAMPLE 1

Two silicon wafers 1⅛ inches diameter and 0.008 inch thickness were mounted with a suitable cement side-by-side onto a work-holding plate and then were required to be cut into elements of truncated-pyramidal form, as illustrated in FIG. 2 of the accompanying drawings, with a base dimension of 0.022 inch and side angles of 60°. A cutting plate of tool steel was provided of the type illustrated in FIG. 3 and having serrations with 60° angle and a distance between crests of 0.026 inch. The plate was 5×2×⅜inch. The radius of the crests was 0.002 inch. Fused alumina of 3-micron particle size was made into a paste with a wax emulsion and a small quantity placed on each wafer. The cutting plate was mounted into a holder and the load pressure adjusted to 1½ lbs. The machine was then oscillated at 85 oscillations per minute. The cutting rate in this first direction was nearly 0.001 inch per minute, the complete cut taking 10 minutes. The work plate was then removed, turned through 90° and replaced. Operation was then repeated under the same conditions but in this second direction the cutting rate was considerably increased and cutting was complete in 5 minutes. The resulting dice has a base dimension of 0.022 inch square and a top dimension of 0.012 inch square with clean straight angle sides and no chipping.

Seven further table loads were cut with the dimensions of the dice still being within acceptable limits after which the wear on the crests of the serrations was 0.002 inch.

EXAMPLE 2

In a specific test, holes of ⅛-inch diameter were drilled through the cutting plate of example 1 to produce a tool of the kind shown in FIG. 4, forming a rectilinear pattern with the holes spaced one-half inch from center to center the pattern being displaced by an angle of 22½° to the normal of the plate. A thin abrasive slurry was then continuously fed to the upper surface of the cutting plate during operation. The cutting rate increased to 0.002 inch per minute in the first direction.

EXAMPLE 3

The cutting plate used in Example 1 was modified in that grooves 1/16-inch wide and ⅛-inch were cut transversely across the serrations of the cutting plate at intervals of one-fourth inch to produce a tool of the type shown in FIG. 6. The cutting rate on the first direction was increased to 0.002 inch per minute.

The invention may be used in the production of truncated-pyramidal form elements of any semiconductor material, for example: silicon, bismuth telluride and gallium arsenide.

The tools may be formed of any suitable material, for example: tool steel, boron carbide or tungsten carbide.

It will be appreciated that many variations are feasible within the scope of invention. Thus, it is possible to effect oscillation of either the tool or the wafer and to feed the tool through the wafer either by moving the tool in towards the workpiece or vice versa.

What is claimed is:

1. A method of manufacturing a monocrystalline semiconductor element of truncated shape comprising the steps of forming in a wafer of monocrystalline semiconductor material having opposed major faces a PN-junction extending parallel to and lying between the major faces of the wafer and subsequently forming a plurality of discrete monocrystalline semiconductor elements of truncated-pyramidal shape from said wafer by cutting the wafer into sections and simultaneously bevelling the edges of the sections adjacent the cut in a single step comprising oscillating a substantially V-shaped knife-edged cutting tool to cut completely through the wafer, a plurality of cutting steps being utilized to cut the wafer into a plurality of discrete monocrystalline semiconductor elements wherein the sidewalls of each of the elements are inclined at an angle of other than 90° to the PN-junction.

2. A method as claimed in claim 1 wherein abrasive material is fed to the knife-edged cutting tool during oscillation of the tool.

* * * * *